United States Patent [19]

Younan

[11] Patent Number: 5,157,851
[45] Date of Patent: Oct. 27, 1992

[54] PINCHING GATE VALVE

[75] Inventor: Kais Younan, Troy, Mich.

[73] Assignee: United Solar Systems Corporation, Troy, Mich.

[21] Appl. No.: 771,046

[22] Filed: Oct. 2, 1991

[51] Int. Cl.$^5$ .............................................. F26B 25/00
[52] U.S. Cl. ............................................ 34/242; 34/16
[58] Field of Search ....................... 34/92, 15, 16, 242

[56]  References Cited
U.S. PATENT DOCUMENTS

| | | | |
|---|---|---|---|
| 4,462,332 | 7/1984 | Nath et al. | 118/718 |
| 4,480,585 | 11/1984 | Gattuso | 118/719 |
| 4,545,136 | 10/1985 | Izu et al. | 34/155 |
| 4,874,631 | 10/1989 | Jacobson et al. | 427/39 |

Primary Examiner—Henry A. Bennet
Attorney, Agent, or Firm—Krass & Young

[57] ABSTRACT

A pinching gate valve for isolating the inside of a vacuum chamber equipped with a slot for passageway of a continuous substrate web therethrough. The pinching gate valve contains three components: a base plate having two inclined first sealing surfaces surrounding a substrate slot; a pair of mating jaws mounted for reciprocal movement toward and away from each other, each of said jaws including an inclined, second sealing surface for mating engagement with one of the first sealing surfaces, and a flat clamping surface for engagement with a surface of the substrate web; and means for reciprocating the jaws from a first, open position, to a second, clamping position.

5 Claims, 2 Drawing Sheets

PINCHING GATE VALVE

FIELD OF THE INVENTION

This invention relates generally to the field of vacuum chambers for depositing a material upon a continuous substrate web, and, more particularly, to a pinching gate valve used to isolate such a vacuum chamber from the external environment during those time periods when linear movement of the web is halted.

DESCRIPTION OF THE RELEVANT PRIOR ART

From an efficiency standpoint, the superiority of continuous processing methods over batch processing methods is recognized in such diverse areas of technology as computer data processing and automotive assembly. In batch processing, individual work units are processed one at a time; in continuous processing, successive processing steps are performed on a continuous stream of workpieces.

In the semiconductor fabricating industry, it has only recently become possible to employ continuous processing techniques. While semiconductors employing crystalline materials featuring a regular lattice structure can only be produced practically by batch processing, this limitation is not true of amorphous semiconductor materials. In particular, techniques have recently been developed for continuous production of amorphous material semiconductors by "roll-to-roll" techniques. In particular, the various layers of semiconductor material are continuously deposited upon a movable web of substrate material which is successively passed through a series of vacuum deposition chambers. In each vacuum deposition chamber, a different layer of semiconductor material is deposited upon the moving web. Thus, by passing through a succession of such vacuum deposition chamber, the layers of semiconductor material successively build up upon the substrate. Techniques for roll-to-roll formation of amorphous semiconductor devices are described in, for example, U.S. Pat. Nos. 4,492,181; 4,485,125; 4,874,631; 4,841,908; 4,763,602; and 4,798,166.

In systems employing a continuously moving web for subsequent deposition of various semiconductors such as are described in the patents listed above, the web of substrate material is normally supplied by continuously unwinding it from a supply roll of such material. After the semiconductor layers are deposited upon the web, it is then wound upon a take-up roll. Thus, such methods are called "roll-to-roll" processes. Typically, the vacuum deposition chambers are isolated from the outside environment to prevent them from being contaminated and to keep them in thermal equilibrium. Obviously, these vacuum chambers through which the substrate web passes must be provided with passageways. A typical example of a vacuum deposition systems with vacuum chambers having through passages can be seen in, for example, FIG. 2 of U.S. Pat. No. 4,480,585.

While the web is advancing through the multi-chamber deposition system, contaminants must be prevented from entering the supply and take-up roll vacuum chambers. Hence, the passageways formed in these chambers are, typically, provided with various sorts of sealing gaskets which prevent air contaminants from entering the vacuum chambers, but still allow passage of the continuously moving web therethrough.

However, there are situations encountered in production where the web is not moving. For example, after the substrate material on a supply roll has become exhausted, it becomes necessary to replace the exhausted supply roll with a fresh one. So as not to disrupt the continuity of the web, linear movement of the web is halted while the replacement is made; the beginning of the substrate on the new roll is joined in some fashion to the end of the substrate from the exhausted roll. After these two ends have been joined, linear movement of the web resumes. Those portions of the web lying adjacent these two ends cannot be used as semiconductor material and are normally discarded. However, these losses are insignificant in the total production run. Furthermore, it may be necessary to stop linear movement of the web for other reasons, such as a breakdown in the machinery.

The problem of contamination of the vacuum chambers becomes particularly acute during those times when linear movement of the web is halted. In these situations, something more than the normal sealing gasket is needed to prevent contaminants from entering the chambers.

While a variety of devices for preventing cross contamination of the vacuum deposition chambers, themselves, are known and described in the prior art (see, for example, U.S. Pat. Nos. 4,462,332 and 4,545,136), such prior art devices involve complicated and expensive structures such as non-reactive gas curtains, magnetic fields, and graded gas valves.

An even bigger problem is maintaining the thermal equilibrium of the interior of the chamber. If the chambers are brought up to atmospheric pressure during a line shut-down, the heaters which heat the chambers to the temperatures required by the deposition process must be turned off. Hence, the chambers cool down, and must be brought back up to deposition temperature when production resumes. This can cause the line to be down for four hours or more, a great waste of time and efficiency. Thus, it is important to seal the chamber both atmospherically and thermally.

It would be desirable to provide a device for isolating the interior of a roll vacuum chamber such as described above during those periods that the web remains stationary. It would be particularly desirable to provide a means for isolating such a chamber that is mechanically simple, easy to construct, and easy to operate.

SUMMARY OF THE INVENTION

Disclosed and claimed herein is a pinching gate valve for isolating the interior of a chamber having a passageway formed in a wall thereof, such passageway being adapted for feeding a continuous substrate web therethrough during a continuous vacuum deposition process. The pinching gate valve comprises three components: a base plate mounted on an inside wall of the chamber; a pair of cooperating jaws for engagement with the base plate; and a means for linearly reciprocating the cooperating jaws toward and away from each other.

The base plate has a slot formed therein for alignment with the chamber passageway. Two inclined, first sealing surfaces surround said slot. The pair of mating jaws each include an inclined, second sealing surface for mating engagement with one of the first sealing surfaces, as well as a flat clamping surface for engagement with one of the surfaces of the substrate web. The jaws reciprocate from a first position, wherein the clamping surfaces are spaced apart from each other to permit passage of the substrate web therethrough, to a second position, wherein the first and second sealing surfaces are engaged to form an air-tight seal and the clamping surfaces squeeze the substrate therebetween to form an air-tight seal therewith.

Typically, the means for reciprocating the jaws from the first to the second position and back again comprise aligned, threaded bores extending through each of the pair of jaws, the axes of said bores lying parallel to the direction of reciprocal movement of the jaws, and a drive screw inserted into the aligned bores. Rotation of the drive screw causes movement of the pair of jaws with respect to each other.

Preferably, a continuous O-ring seal is disposed on each of the pair of jaws and extends around the periphery of both the second sealing surface and the clamping surface thereof. Since a portion of the clamping surface of each jaw is designed to extend beyond the edge of the substrate web, portions of the continuous O-rings lying on the parts of the clamping surface which extend beyond the edge of the web will engage each other to form an air-tight seal therebetween when the jaws are in the second, clamping position. In contrast, the portions of the continuous O-ring which are disposed on the inclined, second sealing surfaces will engage with the first inclined sealing surfaces of the base plate to form an air-tight seal therebetween, and the portions of the continuous O-rings which are disposed on the clamping surfaces subadjacent or superadjacent the substrate web will engage with one of the surfaces of the substrate web to form an air-tight seal therewith when the jaws are in the second position.

An O-ring seal may also be disposed between the chamber wall and the base plate and extend around the periphery thereof to further assure the integrity of the system by forming a double seal.

BRIEF DESCRIPTION OF THE DRAWINGS

The following detailed description may best be understood by reference to the following drawings, in which.

DETAILED DESCRIPTION OF THE PREFERRED EMBODIMENTS

Figure 1:
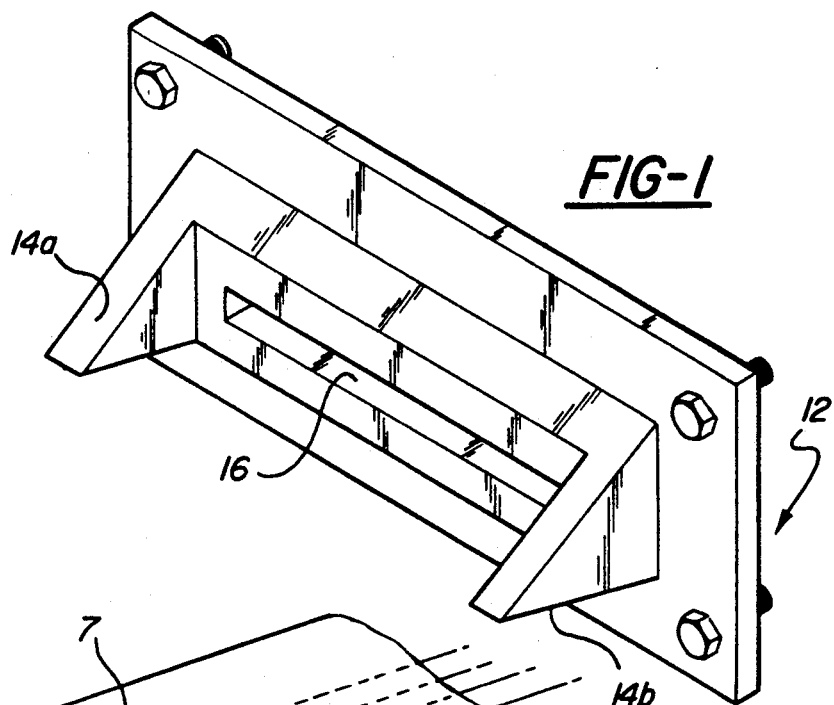
FIG. 1 is a perspective view of the base plate portion of the pinching gate valve of the present invention.

Throughout the following detailed description, like reference numerals are used to refer to the same element of the invention shown in multiple figures thereof.

Figure 6:
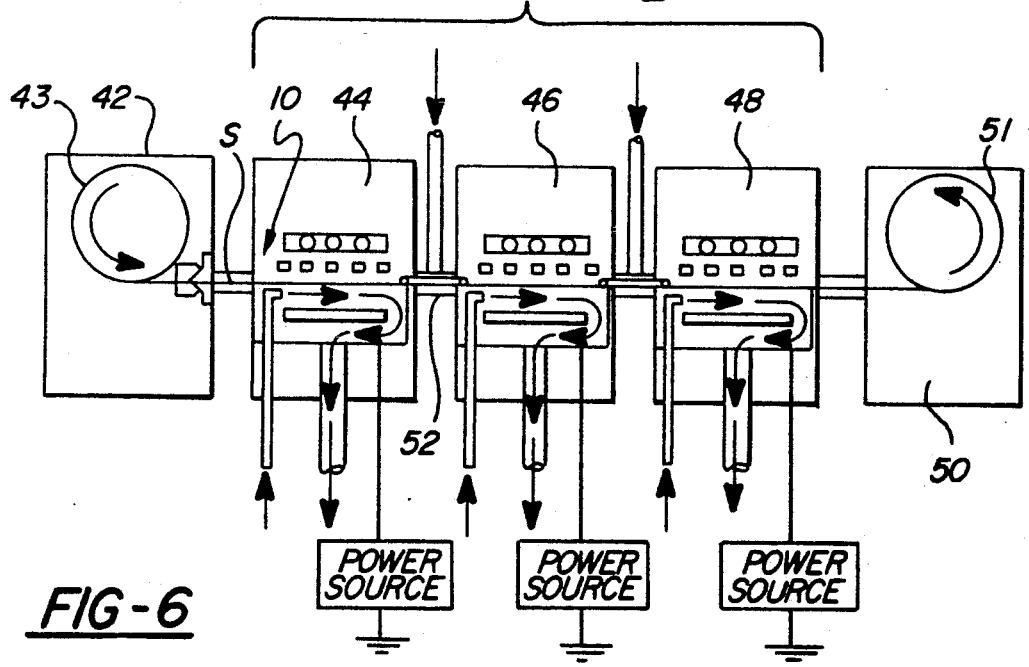
FIG. 6 is a schematic depiction of a multi-chamber, vacuum deposition system employing the pinching gate valve of the present invention.

Referring now to the drawings and in particular to FIG. 6, there is depicted a diagrammatic representation of a multiple vacuum chamber deposition apparatus for the continuous production of, for example, photovoltaic cells, generally referenced by the numeral 40. The continuous deposition apparatus 40 includes a plurality of isolated, dedicated deposition chambers 44,46,48 which are interconnected in tandem. A web of substrate material S is unwound from a supply roll 43 located inside vacuum chamber 42 and sequentially passes through the chambers 44,46,48, whereupon it is then wound up on take up roll 51 which is located inside vacuum chamber 50.

The deposition apparatus 40 is specifically adapted to deposit, on a mass production basis, large area of photovoltaic cells having a p-i-n type configuration, onto the deposition surface of substrate material S which is continuously fed therethrough. In order to deposit the semiconductor layers required for producing multiple p-i-n type cells the deposition apparatus 4 must include at least one triad of deposition chambers, although multiple triads may be provided. Each triad of deposition chambers comprises: a first deposition chamber 44 in which a p-type conductivity semiconductor layer is deposited onto the deposition surface of the substrate S as the substrate S passes therethrough; a second deposition chamber 46 in which an intrinsic amorphous semiconductor layer is deposited atop the p-type semiconductor layer on the deposition surface of the substrate S as the substrate S passes therethrough; and a third deposition chamber 48 in which an n-type conductivity semiconductor layer is deposited atop the intrinsic layer on the deposition surface of the substrate S as the substrate S passes therethrough.

A more complete description of the structures, such as cathode shield, gas supply conduit, power source, evacuation conduit, magnetic elements and radiant heating elements, which are contained in typical deposition chambers of the type to which the present invention is applicable is contained in U.S. Pat. No. 4,480,585. Since they are not critical to the practice of the present invention, these structures will not be described in detail.

To form a semiconductor such as a p-i-n photovoltaic cell, the layers are successively deposited onto substrate S as it passes through deposition chambers 44,46,48. During production, the web of substrate material S is continuously supplied from supply roll 43 and continuously taken up upon take up roll 51. Obviously, when supply roll 43 becomes exhausted of substrate material S, it must be replaced. In order to perform the replacement of the rolls, linear progress of substrate 10 through chambers 44,46,48 is temporarily halted since supply roll vacuum chamber 42 must necessarily have a passageway through which substrate web S passes. Similarly, take up vacuum chamber 50 must include a similar passageway. The problem of preventing contaminants from entering the vacuum chambers 44, 46, 48 becomes particularly acute at this time.

While the foregoing description is directed to a vacuum deposition system adapted for the fabrication of semiconductors, the application of the present invention is not intended to be so limited. The pinching gate valve claimed herein is useful to isolate a vacuum chamber involved in any continuous, roll-to-roll vacuum deposition process such as is employed to fabricate, for example, metalized plastics.

In order to eliminate the possibility of such contamination and thermally isolate the inside of vacuum chambers 44, 46, 48 they may be provided with the pinching gate valve 10 of the present invention. As can best be seen in FIG. 3, which is a cross-sectional view, the pinching gate valve 10 comprises three components:

base plate 12; a pair of mating jaws 18 mounted for reciprocal movement toward and away from each other; and a means for reciprocating said jaws toward and away from each other in the form of a drive screw 28.

Base plate 12 is shown in perspective in FIG. 1. It includes two inclined, first sealing surfaces 14a,14b which surround a substrate slot 16 formed in the plate 10. Slot 16 is configured such that, when base plate 12 is mounted on an inside wall of vacuum chamber 44, the slot 16 will align with the vacuum chamber passageway to permit passage of the web of substrate S therethrough. Preferably, as can be seen in FIG. 3, a continuous O-ring 32 is disposed, between base plate 12 and the wall of the chamber 44.

Figure 2:
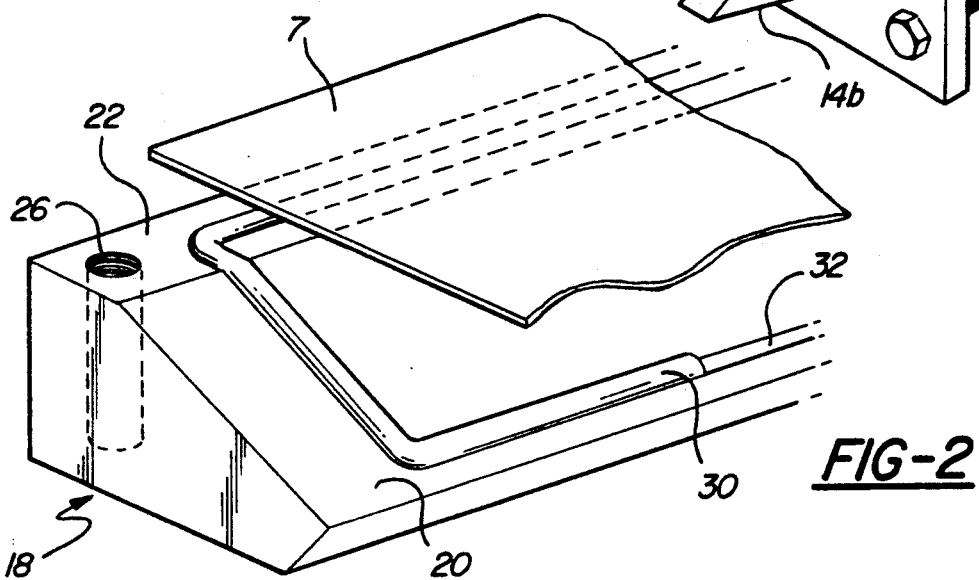
FIG. 2 is a perspective view of a portion of one of the pair of mating jaws of the pinching gate valve of the present invention.

Part of one of the pair of mating jaws 18 is depicted in perspective in FIG. 2. Each pair of mating jaws 18 includes an inclined second sealing surface 20 for mating engagement with the corresponding first sealing surface 14a,14b located on base plate 12. Each mating jaw 18 further includes a flat clamping surface 22 for engagement with a surface of the substrate web S. As can be seen in FIG. 3, a portion 23 of each end of mating jaw 18 extends beyond the edges of substrate S. Each jaw 18 is provided with a continuous O-ring 32 which extends around the periphery of second sealing surface 20 and clamping surface 22. A tapped bore 26 is formed in each jaw 18, said bores 26 being configured to align with each other. The axes of bores 26 are parallel to the direction of reciprocal movement of the jaws 18.

Figure 3:
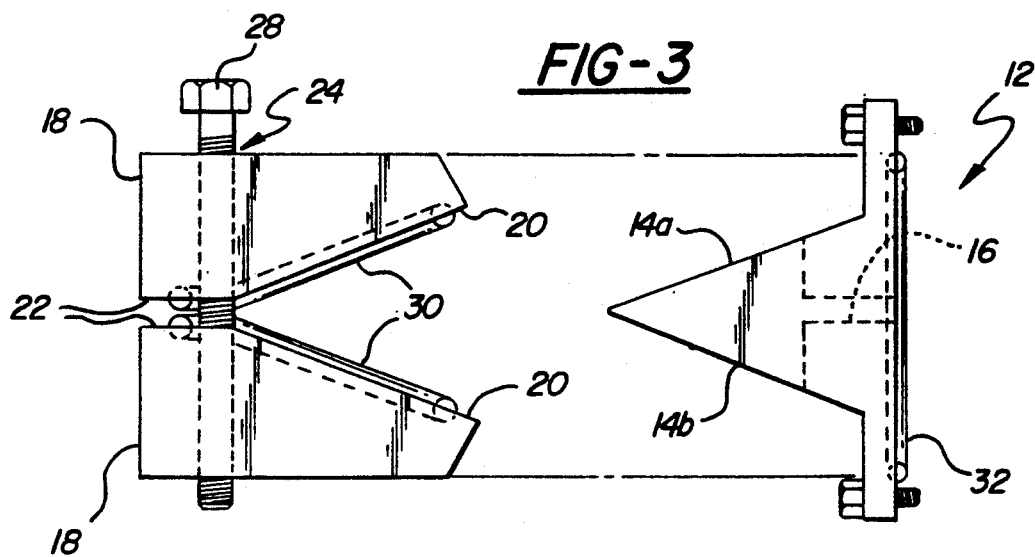
FIG. 3 is an end view of the base plate and pair of jaws of the pinching gate valve of the present invention with hidden structures shown in phantom.
Figure 4:
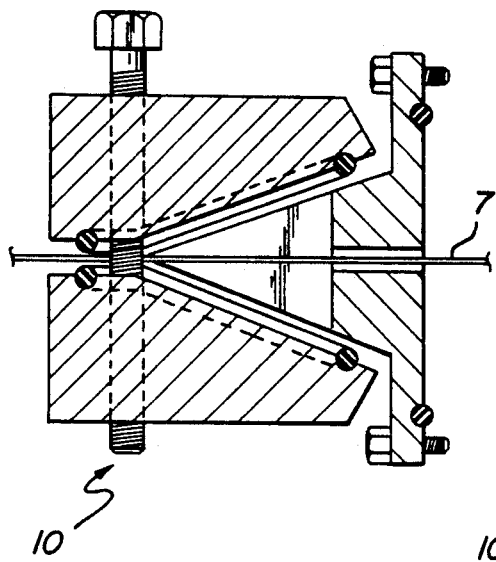
FIG. 4 is a cross sectional view of the pinching gate valve of the present invention in the first, open position.
Figure 5:
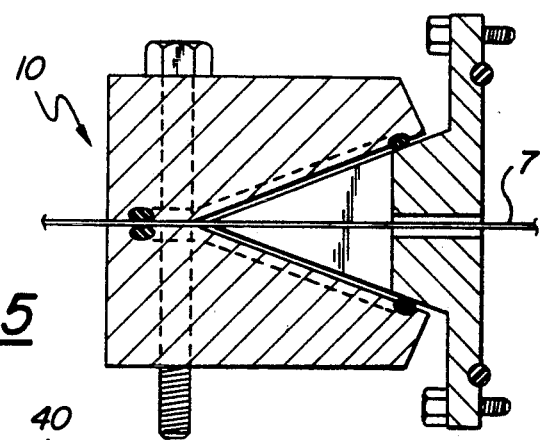
FIG. 5 is similar to FIG. 4 but shows the valve in the second, closed position.

As can be seen in FIGS. 3, 4 and 5, a drive screw 28 extends through aligned bores 26. By suitable rotation of drive screw 28, the jaws can be reciprocated from a first, open position (depicted in FIG. 4), wherein the jaws 18 are disposed apart from each other for a distance to permit passage of semiconductor web S therethrough, to a closed, second position (shown in FIG. 5) wherein the clamping surfaces 22 squeeze the substrate web S therebetween to form an airtight seal therewith.

As can be seen in FIGS. 4 and 5, the pair of mating jaws 18 are disposed with respect to the base plate 12 such that, when the jaws reciprocate toward each other to the closed position depicted in FIG. 5, the second sealing surfaces 20 of the jaws 18 engage with the first sealing surfaces 14a,14b of base plate 12. The O-rings 32 disposed on the second sealing surfaces 20 and clamping surfaces 22 compress to form an airtight seal with, respectively, the first sealing surfaces 14a,14b and the surfaces of substrate web S when the jaws 18 are in the closed position. When the jaws 18 are closed, those portions 23 of clamping surfaces 22 which extend beyond the edges of substrate web S, instead of engaging with a surface of substrate web S, will engage with the portion 23 of the other of the mating jaws 18.

Thus, when the jaws 18 are in the closed position, all portions of the continuous O-rings 32 disposed on the jaws 18 will be in airtight engagement with another structure. The portion of the continuous O-ring 32 disposed on the periphery of second sealing surfaces 20 will engage with first sealing surface 14a or 14b. The portion of continuous O-ring 32 which is disposed on the periphery of clamping surface 22 and either underlies or overlies substrate web S will engage with the upper or lower surface thereof. Finally, the portion of O-ring 32 which is disposed on those portions 23 of clamping surface 2 which extend beyond the edges of substrate web S will engage with the corresponding portions 23 of the continuous O-ring 32 of the other of the mating jaws 18. Hence, a continuous, airtight seal will be formed. In addition, the continuous O-ring 32 disposed around slot 16 and between base plate 12 and the interior wall of chamber 44 will provide a continuous seal against outside contamination of the vacuum chamber 44. Hence, a continuous, double O-ring seal will isolate the interior of the vacuum chamber from the external environment.

The O-rings 32,34 depicted in the embodiment of the device of the present invention shown in the drawings are circular in cross section, but an O-ring having a, for example, square cross section could also be used. To achieve the ends of the present invention it is merely necessary that the cross section of the O-ring be configured such that, as the jaws 18 reciprocate from the first to the second position, the O-ring will compress to form an effective seal, and as the jaws 18 reciprocate back to the first position, the O-ring will resiliently return to its original configuration.

The components of the pinching gate valve 10 of the present invention are relatively simple to manufacture, easy to assemble and simple to operate. Thus, the present invention provides an effective way of isolating the interiors of vacuum chambers through which a substrate web continuously passes during those periods of time when linear progress of the web is halted. To that end, while the means of reciprocating the jaws toward and away from each other is depicted as a drive screw, any other means of imposing reciprocal, linear motion could be used such as, for example, a servo motor, a linear transducer, a piston, etc. Clearly, such mechanical variations are contemplated by the present invention and may be employed by one skilled in the art when using the teachings of the present invention. The scope of the invention described and claimed herein is not intended to be limited by the embodiments and exemplifications depicted herein, but solely by the claims appended hereto and reasonable equivalents thereof.

I claim:

1. A pinching gate valve for isolating a vacuum chamber of a vacuum deposition system, said chamber having a slot formed therein for passage of a continuous substrate web therethrough, said pinching gate valve comprising;

a base plate mounted on an inside wall of said chamber and having two inclined, first sealing surfaces surrounding a substrate slot formed in said plate;

a pair of mating jaws mounted for reciprocal movement toward and away from each other, each of said jaws including an inclined, second sealing surface for mating engagement with one of said first sealing surfaces and a flat clamping surface for engagement with a surface of said substrate web; and means for reciprocating said jaws from a first position, wherein said clamping surfaces are spaced apart from each other to permit passage of said substrate web therethrough, to a second position, wherein said second sealing surfaces engage with said first sealing surfaces to form an airtight seal therebetween, and said clamping surfaces squeeze said substrate web therebetween to form an airtight sea therewith.

2. The pinching gate valve of claim 1 further comprising an O-ring seal disposed on each of said jaws and extending around the periphery of said second sealing surface and said clamping surface thereof.

3. The pinching gate valve of claim 1 further comprising an O-ring seal disposed between said chamber wall and said base plate and extending around the periphery thereof.

4. The pinching gate valve of claim 1 wherein the reciprocating means comprises aligned, threaded bores extending through said pair of jaws, the axes of said bores being parallel to the direction of reciprocal movement of said jaws, and a drive screw extending through said aligned bores such that rotation of said drive screw causes movement of said pair of jaws with respect to each other.

5. The pinching gate valve of claim 2 wherein portions of each O-ring seal disposed on the clamping surfaces extend beyond the edges of said substrate web such that, when the jaws are in the second position, said O-ring portions disposed on one of said pair of jaws engages directly with said O-ring portions disposed on the other of said jaws.

* * * * *